United States Patent [19]
Hobbins et al.

[11] 4,395,294
[45] Jul. 26, 1983

[54] COPPER CORROSION INHIBITOR

[75] Inventors: Norris D. Hobbins, North Plainfield; Ronald F. Roberts, Somerset, both of N.J.

[73] Assignee: Bell Telephone Laboratories, Incorporated, Murray Hill, N.J.

[21] Appl. No.: 293,446

[22] Filed: Aug. 17, 1981

[51] Int. Cl.³ .................................................. C23F 5/02
[52] U.S. Cl. ............................ 148/6.14 R; 106/14.16; 228/214; 428/457; 148/31.5
[58] Field of Search ................... 148/6.14 R; 228/214; 252/294; 106/14.16; 428/457

[56] References Cited
U.S. PATENT DOCUMENTS

| | | | |
|---|---|---|---|
| 3,645,772 | 2/1972 | Jones | 148/6.14 R |
| 3,716,421 | 2/1973 | Burkhart | 148/6.14 R |
| 3,933,531 | 1/1976 | Sawa | 148/6.14 R |

Primary Examiner—Sam Silverberg
Attorney, Agent, or Firm—Bruce S. Schneider

[57] ABSTRACT

The treatment of copper with 5-methyl benzimidazole yields excellent protection from oxidation and/or corrosion of the treated copper body. Additionally, this treatment does not interfere with subsequent soldering of the copper.

13 Claims, 2 Drawing Figures

COPPER CORROSION INHIBITOR

BACKGROUND OF THE INVENTION

1. Field of the Invention

This invention relates to metal treatment and, in particular, corrosion inhibition.

2. Art Background

Copper is a very important material for use in a vast number of applications. Not only is copper used for its aesthetic appearance in ornamental objects, but additionally the electronics industry heavily relies upon copper for its electrical conductivity properties. Whether copper is used in ornaments or in the high technology products, oxidation or corrosion of this metal seriously degrades its usefulness for the desired application.

A variety of treatments have been developed to prevent oxidation and corrosion with their associated adverse effects. The difficulties in finding a suitable oxidation and corrosion inhibitor are particularly great in the electronics industry. The treatment must not only produce effective oxidation and corrosion inhibition, but also the treatment must not prevent subsequent fabrication procedures such as soldering of the treated copper surface. Additionally, since corrosion or oxidation severely degrades electrical properties, an effective oxidation or corrosion inhibitor must be operative over an extended period of time.

Many compounds have been employed for corrosion or oxidation inhibition. For example, benzotriazole (BTA) has been used extensively in the electronics industry to produce a corrosion and oxidation-free surface that is amenable to subsequent soldering. Although BTA has been found to be quite useful, it is always desirable, if possible, to find and utilize inhibitors that have even greater lifetimes provided they also have the necessary properties for related operations such as soldering. In this regard, a variety of compounds have been tested as inhibitors. (See J. B. Cotton, Proc. *2nd International Congress of Metallic Corrosion*, page 590, New York (1963), and J. B. Cotton and I. R. Scholes, *British Corrosion Journal*, 2, page 1 (1967).) However, despite a substantial effort, BTA is still considered the best inhibitor.

SUMMARY OF THE INVENTION

The treatment of copper or other metals such as copper (containing) alloys with 5-methyl benzimidazole (MBA) yields excellent oxidation and corrosion inhibition. Additionally, this treatment does not interfere with the subsequent soldering of treated copper. The results of aging tests particularly in humid environments indicate that MBA is significantly more effective than BTA.

DETAILED DESCRIPTION

FIG. 1 relates to parameters utilized in the subject invention and

FIG. 2 illustrates a use of the subject invention.

BRIEF DESCRIPTION OF THE DRAWING

The effect of the MBA is not dependent on any particular pretreatment of the metal to be treated, e.g., the copper. However, it is generally desirable to clean the metal, e.g., copper, treatment with the MBA to allow the greatest interaction between the MBA and the copper surface. It is established from surface chemical analysis that the corrosion inhibition effect of the MBA results from a film composed of a composition produced by a chemical interaction between the MBA and the protected metal, e.g., the copper. This interaction is somewhat diminished if surface contamination is present. Conventional techniques for removing contamination, such as treatment with an organic solvent to remove oil or similar contamination, and treatment with aqueous acid solution to remove excess oxide or other inorganic contamination is typically employed.

In a preferred embodiment, the metal is treated by immersion in a warm solution of the MBA. Although it is not essential that the solution be warmed, enhanced interaction between the MBA and the metal occurs when the temperature employed is in the range 20 to 80 degrees C., preferably 45 to 65 degrees C. Additionally, the form of solution, i.e., aqueous or non-aqueous, is not essential. However, it is most convenient to use a aqueous solution.

Figure 1:
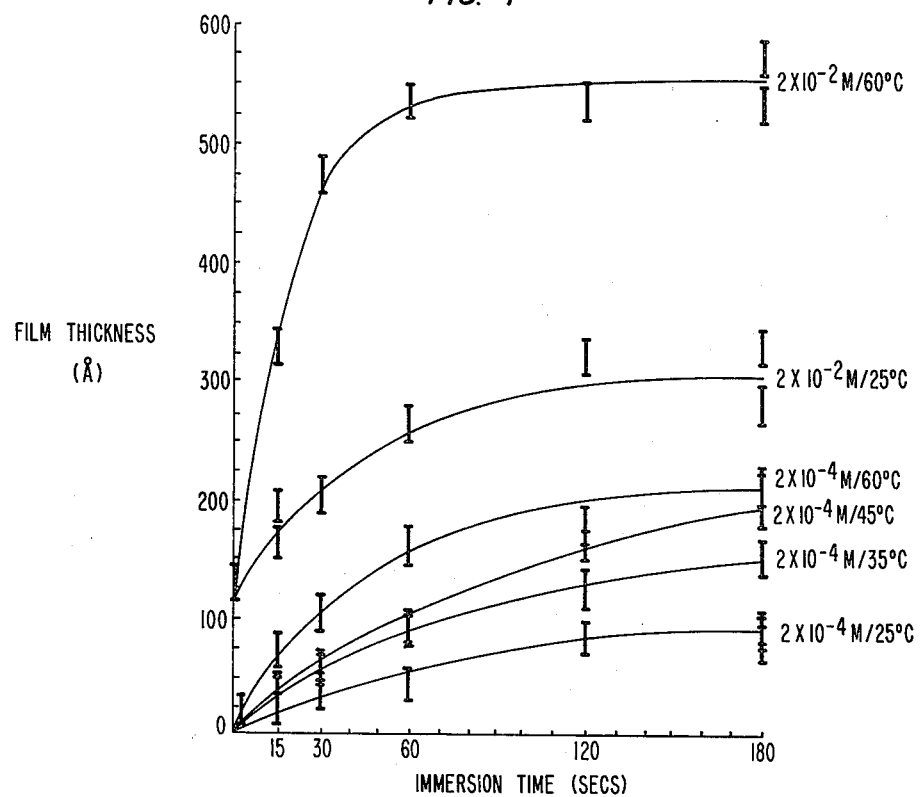

The concentration of the solution and the time of immersion in this solution determines the amount of MBA which reacts with and remains on the metal to inhibit corrosion and/or oxidation. It is generally desirable to form between the MBA and the metal an interaction layer which has a thickness in the range 5 to 60 nm. (Films thicker than 60 nm do not generally yield an additional amount of protection that is needed for most applications, and thus although not precluded are not typically advantageous. Thinner layers yield shortened inhibition periods.) Generally, treatment times in the range 0.5 to 4 minutes for solution concentrations in the range of $10^{-4}$ to $10^{-1}$ M afford the preferred degree of interaction layer formation. After treatment, the sample is removed from the solution, rinsed in warm deionized $H_2O$, and allowed to dry. If it is desired to subsequently solder a portion of the treated metal, no further processing is necessary. It is possible to solder in the normal manner directly on the treated metal.

The following examples are illustrative of the use of the MBA as an inhibitor and also compare its inhibition efficacy to other inhibitors. Additionally, suitable parameters for processing copper containing metals are illustrated.

EXAMPLE 1

Highly conductive (poly)crystalline copper squares (1 cm×1 cm) were cleaned by first degreasing with benzene. The samples were then air-dried and immersed in aqueous (50 volume percent) nitric acid for 20 seconds. After the nitric acid treatment, the samples are thoroughly rinsed in deionized water. While still wet from the water rinse the copper samples were immersed in a 0.02 M aqueous solution which was maintained at 60 degrees C. The copper squares remained immersed for 3 minutes and stirring was maintained during the immersion period. (The samples were rinsed in 60 degrees C. water after treatment.) A variety of compounds were used to produce the 0.02 M solution and they are listed in Table I as follows:

TABLE I

| Name | Structure | Time of Initial Tarnish |
|---|---|---|
| Benzimidazole | 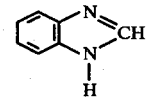 | ~20 Hours |

TABLE I-continued

| Name | Structure | Time of Initial Tarnish |
|---|---|---|
| Benzotriazole | | ~30 Hours |
| 2-Methyl Benzimidazole | | 6 Hours |
| 5-Methyl Benzimidazole | | 120 Hours |
| 5,6-Dimethyl Benzimidazole | | 6 Hours |
| 2,5,6-Trimethyl Benzimidazole | | 6–12 Hours |
| 2-Phenyl Benzimidazole | | 20 Hours |
| Cu$_2$O/Cu (Copper with no azole treatment) | — | ~2 Hours |

The treated samples were exposed to an environment of hydrogen sulfide gas by suspending the squares above a polysulfide reagent in a partially evacuated desiccator at 25 degrees C. (The polysulfide reagent was prepared by first making a saturated aqueous solution of sodium sulfide. An excess (more than 250 g per liter) of flowers of sulfur was added to the saturated solution. After standing 24 hours, the solution was filtered and diluted with water to a specific gravity of 1.142 (at room temperature). The samples in this environment were then periodically visually checked for the first signs of discoloration indicating tarnishing. The time when this initial tarnishing was observed for each type of copper treatment is given in Table 1.

EXAMPLE 2

Optically flat copper substrates were degreased and treated as described in Example 1 with an aqueous solutions of MBA. Various temperatures and concentrations of the aqueous solution containing the MBA were employed. The thickness of the resulting film produced on the copper samples for a given immersion time in the solution was monitored using an ellipsometer to measure thickness. The results obtained are shown in FIG. 1.

EXAMPLE 3

Figure 2:
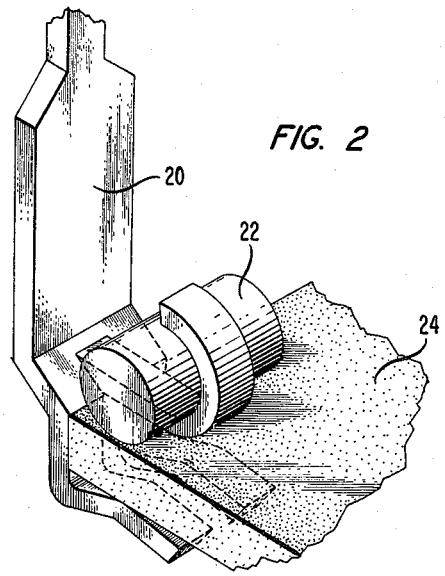

A phosphor bronze copper alloy (Copper Development Association No. 510) lead obtained from North American Specialty Company, Flushing, New York was treated with a 0.02 M MBA solution for 0.5 minutes at 25 degrees C. (The shape of this lead, 20, which contains a solder slug, 22, is shown in FIG. 2.) The lead, 20 was then soldered to a printed circuit board, 24, by condensation soldering. (A description of condensation soldering is found in G. M. Wengen and R. L. Mahajan, *Insulation/Circuits,* 25, page 133 (1979).) The same procedure was followed with a lead that had not been treated with the MBA solution. The untreated lead showed patches where the soldering did not adhere. The treated lead was uniformly coated with the solder.

What is claimed is:

1. A product formed by the process of contacting a metal comprising copper with an oxidation inhibitor to form a protective coating CHARACTERIZED IN THAT said oxidation inhibitor comprises 5-methyl benzimidazole and where said protective coating has a thickness of at least 5 nm.

2. The product of claim 1 wherein a film thickness in the range 5 to 60 nm is formed.

3. The product of claim 1 wherein said contact is accomplished by treating said metal with an aqueous solution of 5-methyl benzimidazole.

4. The product of claim 3 wherein said aqueous solution is heated to a temperature in the range 20 to 80 degrees C.

5. The product of claim 4 wherein said temperature is in the range 45 to 65 degrees C.

6. The product of claim 1 wherein said metal comprises a copper alloy.

7. The process for protecting a metal comprising copper, said process comprising contacting said metal with an oxidation inhibitor to form a protective coating CHARACTERIZED IN THAT said inhibitor comprises 5-methyl benzimidazole and where said protective coating has a thickness of at least 5 nm.

8. The process of claim 7 wherein a film thickness in the range 5 to 60 nm is formed.

9. The process of claim 7 wherein said contact is accomplished by treating said metal with an aqueous solution of 5-methyl benzimidazole.

10. The process of claim 9 wherein said aqueous solution is heated to a temperature in the range 20 to 80 degrees C.

11. The process of claim 10 wherein said temperature is in the range 45 to 65 degrees C.

12. The process of claim 7 wherein said metal comprises a copper alloy.

13. The process of claim 7 including the step of forming a solder connection to said metal.

* * * * *